United States Patent [19]
Amend et al.

[11] 3,935,541
[45] Jan. 27, 1976

[54] LOCKED OSCILLATOR WITH DAMPED OSCILLATORY FEEDBACK

[75] Inventors: Wilhelm Amend, Baierbrunn, Buchenhain; Toma Sotirovic, Munich, both of Germany

[73] Assignee: Siemens Aktiengesellschaft, Berlin & Munich, Germany

[22] Filed: July 16, 1974

[21] Appl. No.: 488,999

[30] Foreign Application Priority Data
July 16, 1973 Germany............................ 2336132

[52] U.S. Cl. ........................... 331/4; 331/8; 331/25
[51] Int. Cl.² .......................................... H03B 3/04
[58] Field of Search ...................... 331/4, 18, 25; 1/8

[56] References Cited
UNITED STATES PATENTS
2,972,720  2/1961  Hume ..................................... 331/4

*Primary Examiner*—Siegfried H. Grimm
*Attorney, Agent, or Firm*—Hill, Gross, Simpson, Van Santen, Steadman, Chiara & Simpson

[57] ABSTRACT

A circuit for locking an otherwise unstable oscillator to a frequency standard oscillation by the use of a discriminator and a differential amplifier, which amplifier produces a low-frequency output signal in response to a lack of synchronization between the oscillator being controlled and the reference oscillator.

2 Claims, 2 Drawing Figures

LOCKED OSCILLATOR WITH DAMPED OSCILLATORY FEEDBACK

BACKGROUND OF THE INVENTION

When an oscillator being controlled is out of synchronization with its standard or reference oscillator, means must be provided for the output of the control circuit to capture the oscillator signal and to phase lock that signal to the reference oscillation. Numerous suggestions have been made in the past to increase the capture range of such control circuits. An example of this is described in German Pat. No. 1,140,969. In the case of initially switching on the circuit or of a failure of synchronization a control signal derived from the difference frequencies between the two oscillators occurs and a circuit is provided to produce a very low oscillation. If this oscillation is superimposed upon a subsequent adjusting voltage, the free-running oscillator can reach synchronization range. Since the alternating voltage corresponding to the difference frequency does not exist during synchronization, the criteria for the so-called "wobble" oscillator would also not exist during synchronization.

FIELD OF THE INVENTION

The field of art to which this invention pertains is locked oscillator systems and, in particular, to means to increase the capture range of a freely-running oscillator which has lost synchronization or which initially does not have synchronization with the reference oscillator.

SUMMARY OF THE INVENTION

It is an important feature of the present invention to provide a new locked oscillator.

It is another feature of the present invention to provide a locked oscillator with increased capture range.

It is an important object of the present invention to provide a locked oscillator which is controlled by a discriminator and an amplifier which produces a "wobble" frequency to increase the capture range of the system.

It is another object of the present invention to provide a differential amplifier for use in a circuit as described above wherein a feedback path is provided to produce a low-frequency "wobble" when a control signal exists at the output of the phase discriminator, indicating a lack of synchronization between the oscillators.

It is also an object of the present invention to provide a circuit as described above, wherein the feedback circuit in the differential amplifier consists of a series RC circuit.

It is also an object of the present invention to provide a circuit as described above, wherein the "wobble" frequency in the differential amplifier is approximately 1 Hz.

It is a further object of the present invention to provide a differential amplifier having two stages as described above wherein the regenerative feedback circuit is coupled from the output of the second stage to the input of the first stage and wherein the control criteria for the free-running oscillator is taken from the collector of the first stage.

These and other objects, features and advantages of the present invention will be understood in greater detail from the following description and the associated drawing wherein reference numerals are utilized to designate a preferred embodiment.

DESCRIPTION OF THE PREFERRED EMBODIMENT

The present invention relates to a locked oscillator which utilizes a discriminator in an amplifier to produce a control voltage to adjust the frequency of a free-running oscillator to the frequency of a standard oscillator. This is accomplished generally in accordance with the present invention in such a way that the amplifier in the control loop has a regenerative feedback branch which is dimensioned in such a way that the amplifier carries out a dampened oscillation in response to the presence of a signal output from the phase discriminator indicating a lack of synchronization between the oscillators.

The amplifier of the present invention is formed in two stages and the regenerative coupling is through a series resistance capacitor network from the output of the second stage to the input of the first stage. The amplifier takes the form of a differential amplifier which in the preferred embodiment has its time constants arranged in such a way that the short time excited oscillation produced therein have a frequency of approximately 1 Hz.

In the preferred embodiment, the amplifier is a transistor amplifier with common emitters and the collector resistances of each of the transistor stages compared to the common emitter resistances are relatively higher. The control voltage which is used to supply the control circuit of the free-running oscillator is taken from the collector resistance of the first transistor. In addition, a capacitor having a magnitude which makes it an ac short circuit is connected in parallel with the collector resistance of the second stage transistor. This circuit arrangement as compared with prior art circuit arrangements has a much simpler and hence less costly construction while achieving all of the advantages of such prior art circuits.

Figure 1:
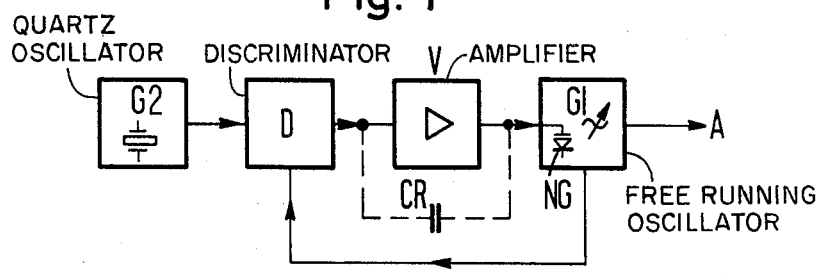
FIG. 1 is a block diagram of the phase-locked circuit of the present invention.

Referring to the drawings in greater detail, FIG. 1 shows the principles of operation of the present invention by use of a block diagram wherein a free-running oscillator G1 is shown as having a terminal frequency adjusting member NG. By suppling a voltage to this member, the frequency of the oscillator G1 may be adjusted to be equal to the stable frequency of a quartz oscillator G2. This control is effected in a prior art manner, either in accordance with the principles of frequency or phase control where block D is either a frequency of a phase discriminator. The output voltage of this discriminator is usually supplied to the terminal adjusting member NG by way of a control amplifier V. In accordance with this invention, this amplifier V, which usually transmits only the subsequent adjusting direct voltage to the free-running oscillator G1, is regeneratively fed back within itself to produce an alternating voltage by way of the above-mentioned series resistance capacitor branch. This series resistance capacitor branch is dimensioned in such a way that the amplifier carries out a slow oscillation for only a short time when a voltage is received at its input from the phase or frequency discriminator. Such a voltage input always occurs when the oscillator is suddenly out of step or when frequency displacement is initially developed during the turn-on time of the system. As is well understood, an alternating voltage is produced at the output of the discriminator which is the difference between the desired oscillation and the standard oscillation provided by the quartz oscillator G2. In the case of a phase-controlled circuit, this is usually the difference between the frequencies of the two generators G1 and G2.

Figure 2:
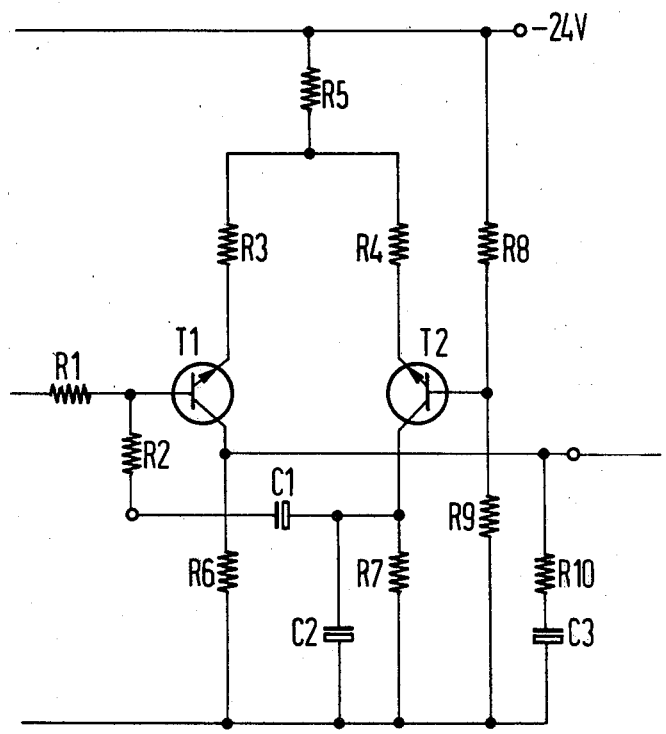
FIG. 2 is a schematic of the amplifier V as shown in FIG. 1, indicating the two stages thereof and the operation of the regenerative feedback circuit from the output of the second stage to the input of the first stage, and also the takeoff circuit from the collector of the first stage for the control signal for the free-running oscillator.

In order to make the amplifier V produce a short-time oscillation, it must be regeneratively coupled via a reactance. In the circuit of FIG. 2 this regenerative coupling is accomplished by the capacitance C1 and the resistance R2. The values of this regnerative-coupling loop are chosen such that the amplifier carries out a low-frequency oscillation when the amplifier receives an input signal from the discriminator.

In the preferred embodiment, C1 and R2 are selected in such a way that the frequency of oscillation by the amplifier is 1 Hz.

In this case, the amplifier V has two stages which include the transistors T1 and T2. This is a difference amplifier which is particularly advantageous since the output voltage which is taken from the collector resistance R6 of the transistor T1 can be amplified to an order of magnitude which is suitable for the operation of capacitance variable diodes for tuning the free-running oscillator. Such diodes are usually used as final adjusting elements for oscillators.

With the help of the resistances R3, R4, R5, the collector resistances R6 and R7 and the resistances R8 and R9 for the adjustment of the base bias of the transistor T2, the operational point of that stage of the amplifier is established.

The control voltage is taken from the collector of the transistor T1, and the alternating voltages which are produced by the discriminator are removed by the capacitance C3. A capacitor C2 is parallel connected to the collector resistance of the transistor T2, and it has a high time constant.

The resistance R10 which is also connected in series with the capacitor C3 determines the nature of the ac path of the control loop. This is also influenced by the sensitivity of the discriminator, the amplification of the amplifier V and the properties of the tuning diodes of the free-running oscillator G1.

The resistance R1 at the input of the circuit serves to decouple the amplifier from the previous discriminator. The following values of the switching elements are given for the preferred embodiment described herein:

R5 = 4,7K; R3 = 100Ω; R4 = 100Ω;
R8 = 3,9K; R1 = 100Ω; R2 = 20K;
C1 = 2µF; R9 = 12K; R10 = 160Ω;
R6 = 20K; R7 = 20K; C2 = 22µF;
C3 = 330nF.

Using the above values, the free-running oscillator G1 was stabilized at approximately 700 MHz.

In operation, when the circuit is initially switched on, the free-running oscillator may or may not be within the holding range of the phase-controlled circuit. If it is, the amplifier T1 and T2 will oscillate only once. The difference frequency, when approaching synchronization, becomes 0, which rapidly decreases the alternating voltage produced by the regenerative feedback of the amplifier, thus ending the searching or capture process.

If the frequency of the free-running oscillator is remote from the desired frequency or outside the holding range, such that the phase-controlled circuit cannot capture the control of the oscillator, the 1 Hz signal will be produced by the amplifier and added to the control voltage which is fed to the oscillator G1 to accomplish the desired capture which then causes the circuit to be brought into synchronization with the oscillator G2 as described above.

The invention claimed is:

1. The combination comprising:
a reference oscillator,
a controlled oscillator having a control input to adjust its oscillation frequency,
a discriminator having inputs received from both said oscillators for comparing the frequencies of each and producing a desired output indicative of the difference frequency therebetween,
an amplifier receiving as its input, the output of said discriminator, and having its output coupled to the control input of the controlled oscillator,
said amplifier having an ac feedback coupling circuit with its parameters chosen to cause said amplifier to carry out a damped oscillation after receiving a signal from the output of said discriminator, indicating non-synchronization between said oscillators, wherein said amplifier has first and second stages and is a difference amplifier and wherein the feedback circuit comprises an ac coupling means from the output electrode of the second stage to the input electrode of the first stage.

2. The combination in accordance with claim 1 wherein said difference amplifier is a two-stage transistor amplifier connected with common emitters, collector resistances being provided for said two-stage transistor amplifier, emitter resistances also provided in series with the emitters of said two-stage transistor amplifier, the collector resistances when compared to the emitter resistances being relatively higher, the control input of the controlled oscillator is coupled from the collector electrode of the first transistor stage, the ac coupling means for feedback is connected from the collector electrode of the second stage to the base electrode of the first stage.

* * * * *